US009094032B2

(12) United States Patent
Dugalleix et al.

(10) Patent No.: US 9,094,032 B2
(45) Date of Patent: Jul. 28, 2015

(54) INTEGRATED CIRCUIT DEVICE AND METHOD OF DYNAMICALLY MODIFYING AT LEAST ONE CHARACTERISTIC WITHIN A DIGITAL TO ANALOGUE CONVERTER MODULE

(75) Inventors: Stephane Dugalleix, Grant (FR); Birama Goumballa, Balma (FR); Gilles Montoriol, Cugnaux (FR)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/233,762

(22) PCT Filed: Jul. 20, 2011

(86) PCT No.: PCT/IB2011/001871
§ 371 (c)(1),
(2), (4) Date: Jan. 20, 2014

(87) PCT Pub. No.: WO2013/011344
PCT Pub. Date: Jan. 24, 2013

(65) Prior Publication Data
US 2014/0152481 A1    Jun. 5, 2014

(51) Int. Cl.
*H03M 1/66* (2006.01)
*H03M 1/06* (2006.01)
*H03M 1/08* (2006.01)
*H03M 1/74* (2006.01)

(52) U.S. Cl.
CPC .............. *H03M 1/06* (2013.01); *H03M 1/0626* (2013.01); *H03M 1/0863* (2013.01); *H03M 1/745* (2013.01)

(58) Field of Classification Search
CPC ... H03M 1/06; H03M 1/0626; H03M 3/0836; H03M 1/0863; H03M 1/64; H03M 1/745
USPC .................. 341/118–121, 134–136, 144–154
See application file for complete search history.

(56) References Cited

U.S. PATENT DOCUMENTS

| | | | |
|---|---|---|---|
| 5,012,178 A | 4/1991 | Weiss et al. | |
| 5,754,072 A | 5/1998 | Mazzetti | |
| 6,201,490 B1 * | 3/2001 | Kawano et al. | 341/139 |
| 6,337,645 B1 * | 1/2002 | Pflaumer | 341/143 |
| 6,995,604 B2 | 2/2006 | Puma et al. | |
| 7,379,005 B2 * | 5/2008 | Wiesbauer et al. | 341/144 |
| 7,421,055 B2 * | 9/2008 | Sekizawa | 375/377 |
| 8,581,756 B1 * | 11/2013 | Duewer et al. | 341/61 |
| 2004/0189502 A1 * | 9/2004 | Lee | 341/152 |
| 2005/0040906 A1 | 2/2005 | Brueske et al. | |
| 2005/0266820 A1 | 12/2005 | Behzad et al. | |
| 2007/0216560 A1 * | 9/2007 | Miyagi et al. | 341/144 |

(Continued)

OTHER PUBLICATIONS

International Search Report and Written Opinion correlating to PCT/IB2011/001871 dated Jun. 6, 2012.

*Primary Examiner* — Linh Nguyen

(57) ABSTRACT

An integrated circuit device comprises at least one digital to analogue converter module. The DAC module includes at least one current replicator component having a first channel terminal, a second channel terminal and a reference voltage terminal arranged to receive a reference voltage signal; the at least one current replicator component being arranged to moderate a current flowing between the first and second channel terminals based at least partly on the received reference voltage signal. The DAC module also includes at least one filter component coupled to the reference voltage terminal to perform filtering of the reference voltage signal.

20 Claims, 4 Drawing Sheets

(56) References Cited

U.S. PATENT DOCUMENTS

| | | |
|---|---|---|
| 2010/0253561 A1 | 10/2010 | Mishra et al. |
| 2011/0050967 A1* | 3/2011 | Matsumoto et al. .......... 348/294 |
| 2011/0102225 A1* | 5/2011 | Liu et al. ...................... 341/144 |
| 2011/0131439 A1* | 6/2011 | Renner et al. ................. 713/401 |

* cited by examiner

INTEGRATED CIRCUIT DEVICE AND METHOD OF DYNAMICALLY MODIFYING AT LEAST ONE CHARACTERISTIC WITHIN A DIGITAL TO ANALOGUE CONVERTER MODULE

FIELD OF THE INVENTION

The field of this invention relates to an integrated circuit device, a digital to analogue converter module and a method of dynamically modifying at least one characteristic within a digital to analogue converter module.

BACKGROUND OF THE INVENTION

It is known for current steering digital to analogue converters (DACs) to be used to control biasing of highly critical radio frequency (RF) elements in wireless communication units and applications. Such current steering DACs are required to have ultra low noise characteristics. In particular, ultra low flicker noise levels are necessary when such a DAC is used in order to control output power of a power amplifier in, say, a radar system.

A conventional technique for achieving low frequency noise conditions for a current steering DAC is to use a passive RC (resistance-capacitance) filter on the reference voltage of a current mirror within the DAC. The higher the RC product of the RC filter, the lower the low frequency noise characteristics. However, a problem with such a technique is that the higher the RC product of the RC filter, the higher is the time constant thereof and, thus, the greater the length of time is required to recover a stable state when the DAC digital input code is changing. Thus, a high RC product within the RC filter limits the speed of the DAC.

SUMMARY OF THE INVENTION

The present invention provides an integrated circuit device, a digital to analogue converter module and a method of dynamically modifying at least one characteristic within a digital to analogue converter module as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Examples of the present invention will now be described with reference to the accompanying drawings. In particular, examples of the present invention being implemented within digital to analogue (DAC) converters comprising a typical current mirror arrangement are described herein and illustrated in the accompanying drawings. However, it will be appreciated that the present invention is not limited to the particular embodiments herein described, and may be equally applied to alternative DAC arrangements in which, for example, a reference voltage is used to moderate one or more current components. Furthermore, because the illustrated embodiments of the present invention may, for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 1:
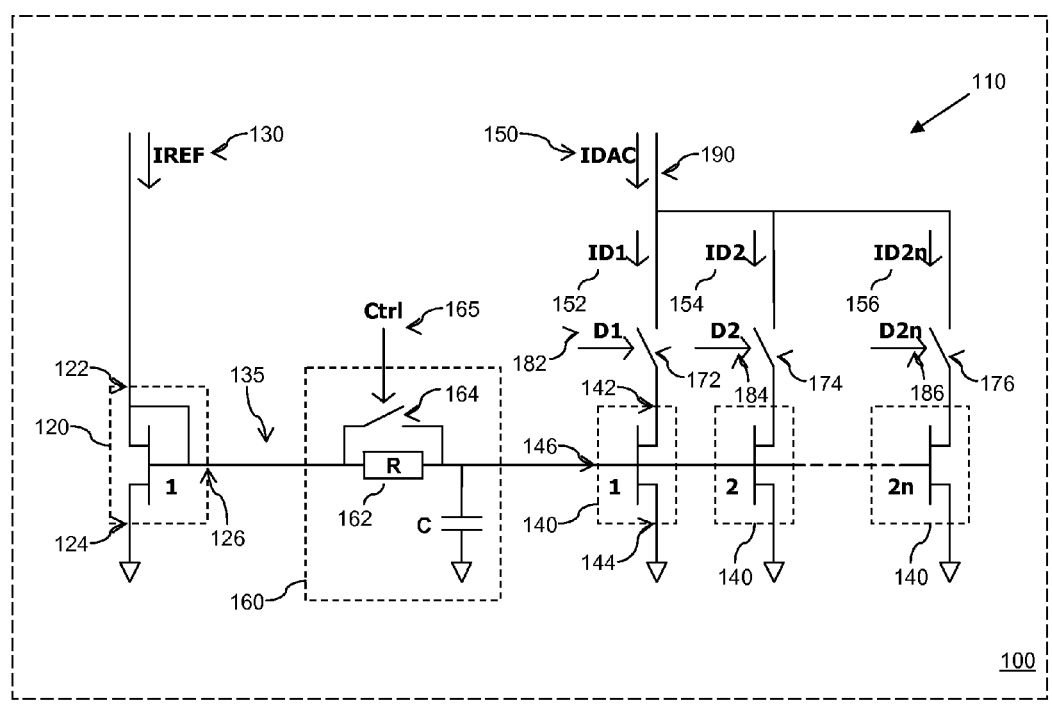
FIG. 1 shows a simplified block diagram of a first example of a digital to analogue converter module.

Referring first to FIG. 1, there is illustrated a simplified block diagram of an example of a digital to analogue converter (DAC) module 110. In the illustrated example, the DAC module 110 is located within an integrated circuit device, indicated generally at 100, and may be adapted for controlling a biasing current within, say, a radio frequency device/wireless communication unit. The DAC module 110 comprises a number of current replicator components, illustrated generally at 140. Each current replicator component 140 comprises a first channel terminal 142, a second channel terminal 144 and a reference voltage terminal 146 that is arranged to receive a reference voltage signal 135. Each current replicator component 140 is arranged to moderate a respective current component 152, 154, 156 flowing between the first and second channel terminals 142, 144 thereof, based at least partly on the received reference voltage signal 135.

In the illustrated example, the DAC module 110 comprises an even number, $2n$ with n representing a positive integer, current replicator components 140. The first channel terminal 142 of each current replicator component 140 is operably coupled to a current node 190 via a controllable switching component 172, 174, 176. The switching components 172, 174, 176 are arranged receive respective bit signals 182, 184, 186 of a digital input signal for the DAC module 110, and to selectively couple the first channel terminals 142 of the respective current replicator components 140 to the current node 190, in accordance with the received respective bit signals 182, 184, 186. Thus, for the illustrated example, for the $2n$ current replicator components 140 there are $2n$ respective switching components, and therefore $2n$ bit signals within the digital input of the DAC module 110. In this manner, a DAC current 150 flowing through the current node 190 comprises the sum of the current components 152, 154, 156 flowing through the respective current replicator components 140 that have been selectively coupled to the current node 190 by the respective switching components 172, 174, 176, in accordance with the received bit signal 182, 184 186 of the digital input.

In the illustrated example, the current replicator components 140 comprise weighted moderation characteristics (e.g. weighted resistive characteristics) such that the current components 152, 154, 156 that are able to flow through the current replicator components 140 are weighted according to the 'significance' of the respective bit signal 182, 184, 186. For example, the current replicator component coupled to the switching component that receives the most significant bit of the digital input signal can provide the largest current, whereas the switching component that receives the least significant bit of the digital input signal can be provide the smallest current.

The shown example of a DAC module 110 further comprises at least one filter component 160 operably coupled to the reference voltage terminals 146 of the current replicator components 140 and arranged to perform filtering of the reference voltage signal 135. In this manner, by filtering the reference voltage signal 135 that is provided to the reference voltage terminals 146 of the replicator components 140, noise introduced into the current components 152, 154, 156 may be reduced. In the illustrated example, the filter component 160 comprises a passive RC (resistance-capacitance) filter, as generally illustrated.

In the illustrated example, the DAC module 110 further comprises at least one current reference component 120 comprising a first channel terminal 122, a second channel terminal 124 and a reference voltage terminal 126. The current reference component 120 is arranged to generate the reference voltage signal 135 at the reference voltage terminal 126 thereof, based at least partly on a reference current 130 flowing between the first and second channel terminals 122, 124 thereof. As such, the filter component 160 is operably coupled between the reference voltage terminal 126 of the current reference component 120 and the reference voltage terminals 146 of each current replicator component 140. Thus, the current reference component 120 and each current replicator component 140 cooperate to form a current mirror arrangement, with the filter component 160 filtering the reference voltage there between.

The RC filter may be configured to achieve a desired RC product thereof, for example by way of a control signal 165. The higher the RC product of such an RC filter, the greater the reduction of low frequency noise characteristics. However, the higher the RC product of the RC filter, the higher the time constant thereof and, thus, the greater the length of time that is required to recover a stable state when the DAC digital input code is changing. Accordingly, such a static configuration technique typically involves a trade-off between low noise characteristics and stable state recovery time.

Figure 2:
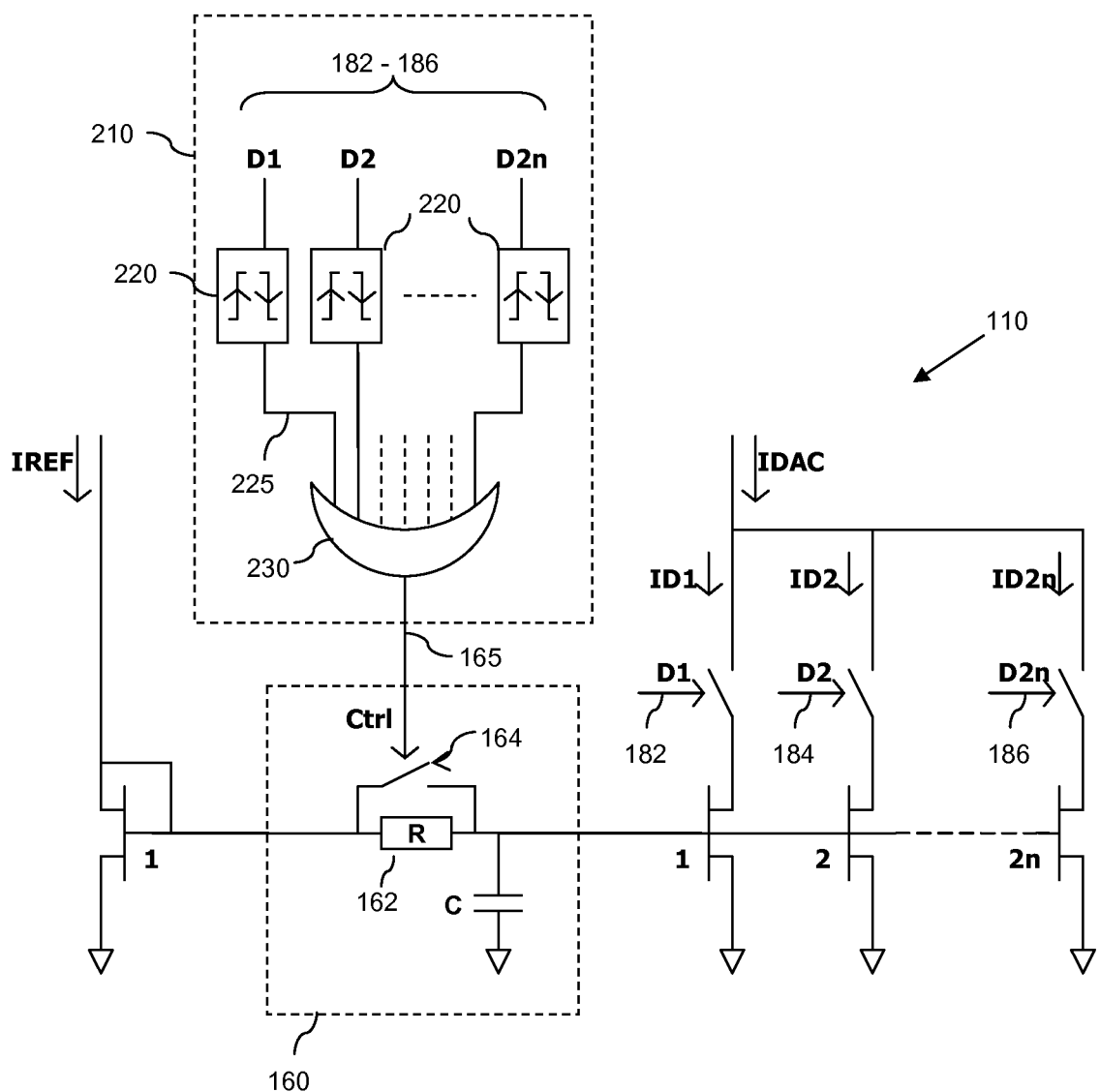
FIG. 2 shows a simplified block diagram of second example of a digital to analogue converter module.

Referring to FIG. 2, there is illustrated a further example of the DAC module 110. In the example illustrated in FIG. 2, the DAC module 110 comprises in addition to the circuitry of the example of FIG. 1, at least one filter control module 210. The at least one filter control module 210 is arranged to detect a state change of the digital input.

The operation of the filter control module 210 will in the following be described using, as an example of a state change detection, detection of at least one edge within one or more bit signals 182, 184, 186 of the digital input of the DAC module 110, and dynamically modify at least one characteristic of the filter component 160 in response to the detection. However, it will be apparent that a state change of the digital input may be detected in any other suitable manner.

The at least one filter control module 210 may cause the filter component 160 to operate in a transition mode, upon detection of at least one edge within the bit signals 182, 184, 186 of the digital input of the DAC module 110. In this manner, upon detection of an edge within the bit signals 182, 184, 186, e.g. when the digital input value of the DAC module 110 is changing, one or more characteristics of the filter component 160 may be temporarily modified. Accordingly, the filter component 160, and thereby the DAC module 110, may be dynamically configured during periods of transition for the bit signals 182, 184, 186 within the digital input to temporarily operate in a different mode. For example, one or more characteristics of the filter component 160 may be temporarily modified to reduce, say, a time constant of the filter component 160, thereby enabling the DAC module 110 to more quickly recover to a stable state following the digital input value change. Accordingly, the DAC module 110 may be dynamically configured to operate in a fast recovery phase during periods of transition for the bit signals 182, 184, 186 within the digital input.

The filter control module 210 may further be arranged to cause the filter component 160 to operate in a stable state mode when an edge is not detected within the bit signals 182, 184, 186, e.g. after the digital input value of the DAC module 110 has changed and is subsequently constant. In this manner, when no edge is detected within the bit signals 182, 184, 186 of the digital input, e.g. when the digital input value of the DAC module 110 is substantially constant, the one or more characteristics of the filter component 160 may be configured to, for example, improve the low frequency noise characteristics of the DAC module 110. Accordingly, the DAC module 110 may be dynamically configured to operate in a low noise phase during periods of substantially constant and stable bit signals 182, 184, 186 within the digital input.

In the illustrated example, the filter control module 210 is arranged to dynamically modify a series resistance characteristic of the filter component 160, and in particular to dynamically reduce a series resistance characteristic of the filter component 160 upon detection of at least one edge within the bit signals 182, 184, 186 of the digital input. For example, the filter component 160 may comprise one or more controllable switching elements, such as illustrated generally at 164, operably coupled in parallel with one or more series resistance elements of the filter component 160, such as illustrated generally at 162. As illustrated in FIG. 2, the controllable switching element(s) 164 may be arranged to selectively create a reduced resistance circuit across the respective series resistance element(s) 162 in accordance with one or more control signals 165 output by the filter control module 210. In this manner, the controllable switching element(s) 164 is arranged to selectively configure (in accordance with the control signal(s) 165) the filter component 160 to comprise either: a first, higher series resistance whereby the configuration filter component 160 operates in a first, low noise mode; and a second, lower series resistance, whereby the configuration filter component 160 operates in a second, faster recovery mode.

In the example illustrated in FIG. 2, the filter control module 210 comprises a plurality of edge detector components 220, each edge detector component 220 being arranged to detect at least one edge within at least one bit signal 182, 184, 186 of the digital input of the DAC module 110. Such a digital edge detector may be implemented using, for example, a logic inverter, a delay and a two-input logic gate arranged to generate an active signal when its two inputs have identical logical values; for example an XNOR or XOR gate depending on active level polarity. The first input of the two inputs gate may be directly connected to the input of the edge detector 220. The second input may be connected to the input of the edge detector 220 through the digital inverter followed by the digital delay: thus the second input is a delayed inverted image of the signal at the input of the edge detector 220.

The filter control module 210 is arranged to dynamically modify at least one characteristic of the filter component 160 upon detection of at least one edge within at least one bit signal 182, 184, 186 of the digital input of the DAC module 110 by at least one of the edge detector components 220. In particular for the illustrated example, each edge detector component 220 is arranged to output an edge detection signal 225 comprising an indication of whether an edge has been detected within the respective bit signal 182, 184, 186. The filter control module 210 further comprises an OR gate 230, the OR gate 230 being arranged to receive the indication 225 output by each edge detector component 220 of whether an edge has been detected, and to output a control signal 165 to dynamically modify at least one characteristic of the filter component 160 upon at least one edge detector component 220 outputting an indication of an edge being detected within a respective bit signal 182, 184, 186 of the digital input of the DAC module 110.

As will be appreciated, whilst an OR gate has been illustrated and described in the example of FIG. 2, other logic arrangements for converting the indications 225 output by the edge detector components 220 into the control signal 165 may be implemented. For example, the OR gate 230 may be replaced with, say, a NOR gate; in which case the logical polarity of the switching element(s) within the filter component 160 may be inverted accordingly.

Figure 3:
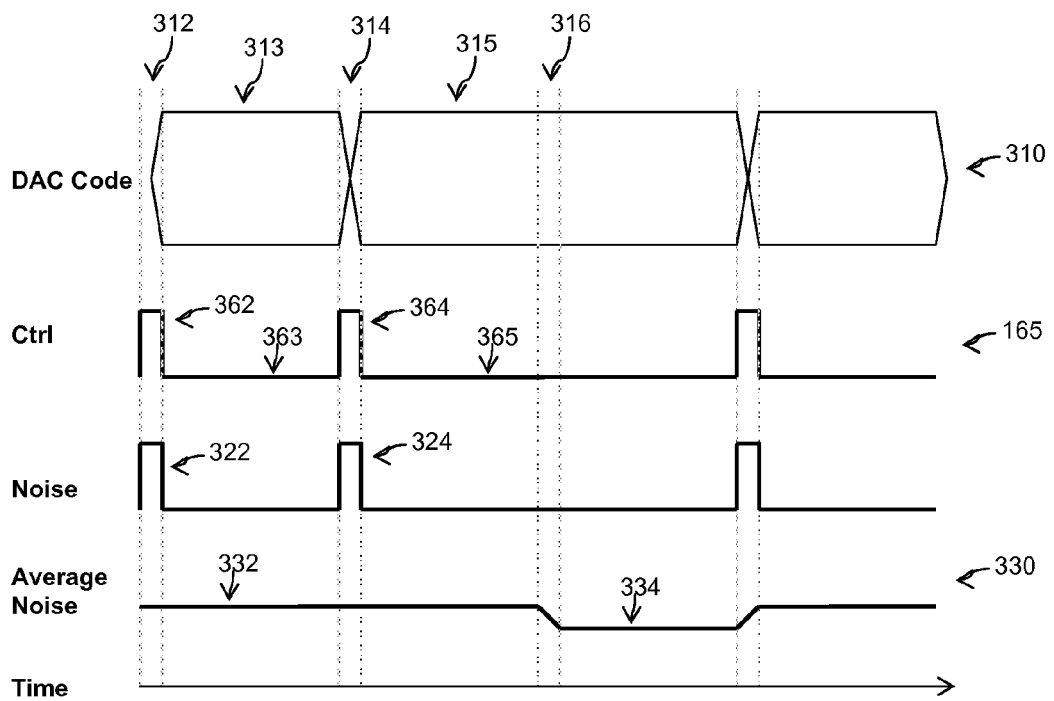
FIG. 3 shows a simplified signal diagram of an example of some of the signals within the example of FIG. 2

FIG. 3 illustrates a simplified signal diagram of an example of some of the signals within the DAC module 110 of FIG. 2. A digital input signal for the DAC module 110, comprising the bit signals 182, 184, 186, is illustrated at 310. The signal diagram of FIG. 3 starts with a transition period 312 within the digital input signal 310, for example triggered by an active edge within a clock signal (not shown). During this first transition period 312, a transition occurs within the digital input signal 310 whereby one or more of the bit signals 182, 184, 186 changes state, and thus comprises an edge. As described above, the filter control module 210 is arranged to output a control signal 165 to dynamically modify at least one characteristic of the filter component 160 upon at least one edge being detected within at least one of the bit signals 182, 184, 186 of the digital input 310 of the DAC module 110. Accordingly, and as indicated at 362, during the transition period 312 when an edge is present within one or more of the bit signal(s) 182, 184, 186, the control signal 165 comprises a transition mode state, which in the illustrated example comprises a '1' or 'HIGH' state.

In the example illustrated in FIG. 2, the transition mode state indicated at 362 (of FIG. 3) of the control signal 165 causes the controllable switching element 164 to create a reduced resistance circuit across the series resistance elements 162 of the filter component 160. In this manner, the transition mode state indicated at 362 of the control signal 165 causes the filter component 160 to be configured to comprise a lower series resistance, whereby the filter component 160 operates in a faster recovery mode. As such, because the filter component 160 is configured to operate in a faster recovery mode, the DAC module 110 is able to more quickly recover a stable state following a transition within the input signal 310. Nevertheless, and as indicated at 322 of FIG. 3, such a faster recovery mode may result in relatively high noise characteristics for the DAC module 110.

Following the transition period 312, the input signal 310 enters a stable state period 313 within the digital input signal 310. During this stable state period 313 no transitions occur within the digital input signal 310, and thus no edges will occur within the bit signals 182, 184, 186. For the illustrated example, during the stable state period 313, the filter control module 210 of FIG. 2 is arranged to cause the filter component 160 to operate in a stable state mode, since no edges will be detected within the bit signal 182, 184, 186 of the digital input 310. Accordingly, during the stable state period 313 when no edges are present within the bit signals 182, 184, 186, the control signal 165 comprises a stable mode state 363, which in the illustrated example comprises a '0' or 'LOW' state.

In the example illustrated in FIG. 2, the stable mode state 363 (of FIG. 3) of the control signal 165 causes the controllable switching element 164 to disconnect the reduced resistance circuit across the series resistance element 162 of the filter component 160. In this manner, the stable mode state 363 of the control signal 165 causes the filter component 160 to be configured to comprise a higher series resistance, whereby the filter component 160 operates in a low noise mode. As such, during the stable state period 313 within the digital signal 310, the low noise mode enables relatively low noise characteristics to be achieved for the DAC module 110.

After a complete clock cycle (not shown), a second transition period 314 occurs within the digital input signal 310. Once again, during this second transition period 314, a transition occurs within the digital input signal 310 whereby one or more of the bit signals 182, 184, 186 changes state, and thus comprises an edge. As a result, during this second transition period 314, the filter control module 210 configures the control signal 165 to comprise a transition mode state, as indicated at 364. Thus, during this second transition period 314, the filter component 160 is configured to operate in the faster recovery mode, thereby enabling the DAC module 110 to more quickly recover a stable state following the transition within the input signal 310.

Following the transition period 314, the input signal 310 again enters a stable state period 315 within the digital input signal 310. Once again, during this second stable state period 315, the filter control module 210 configures the control signal 165 to comprise a stable mode state, as indicated at 365. Thus, during this second stable state period 315, the filter component 160 is configured to operate in the low noise mode, enabling relatively low noise characteristics to be achieved for the DAC module 110.

An average noise level for the DAC module 110 is illustrated at 330. By dynamically configuring the characteristics of the filter component 160 based on the detection of edges within the input signal 310 as described above, the DAC module 110 is capable of being dynamically configurable to operate in a first, fast recovery mode and a second, low noise mode in a substantially optimised manner. Although during transition periods 312, 314 for the input signal 310 the DAC module 110 may be configured to operate in a relatively high noise mode, the average noise characteristics over a complete clock cycle remains relatively low, as illustrated generally at 332, by virtue of the relatively long stable state periods 313, 315 between such transition periods 312, 314.

Advantageously, during a transition period whereby no transition occurs within the digital input signal 310, such as illustrated at 316, none of the bit signals 182, 184, 186 of the digital input signal 310 will change state. As such, during such a transition period 316 the filter control module 210 may continue to configure the control signal 165 to comprise the stable mode state 365. Thus, during this 'transitionless' transition period 316, the filter component 160 remains configured to operate in the low noise mode, enabling relatively low noise characteristics to be maintained for the DAC module 110. Thus, for clock cycles for which the transition period comprises no transition, such as transition period 316, the average noise level for the DAC module 110 over that clock cycle may be further reduced, as indicated at 334, without substantially impacting on the overall system performance.

Figure 4:
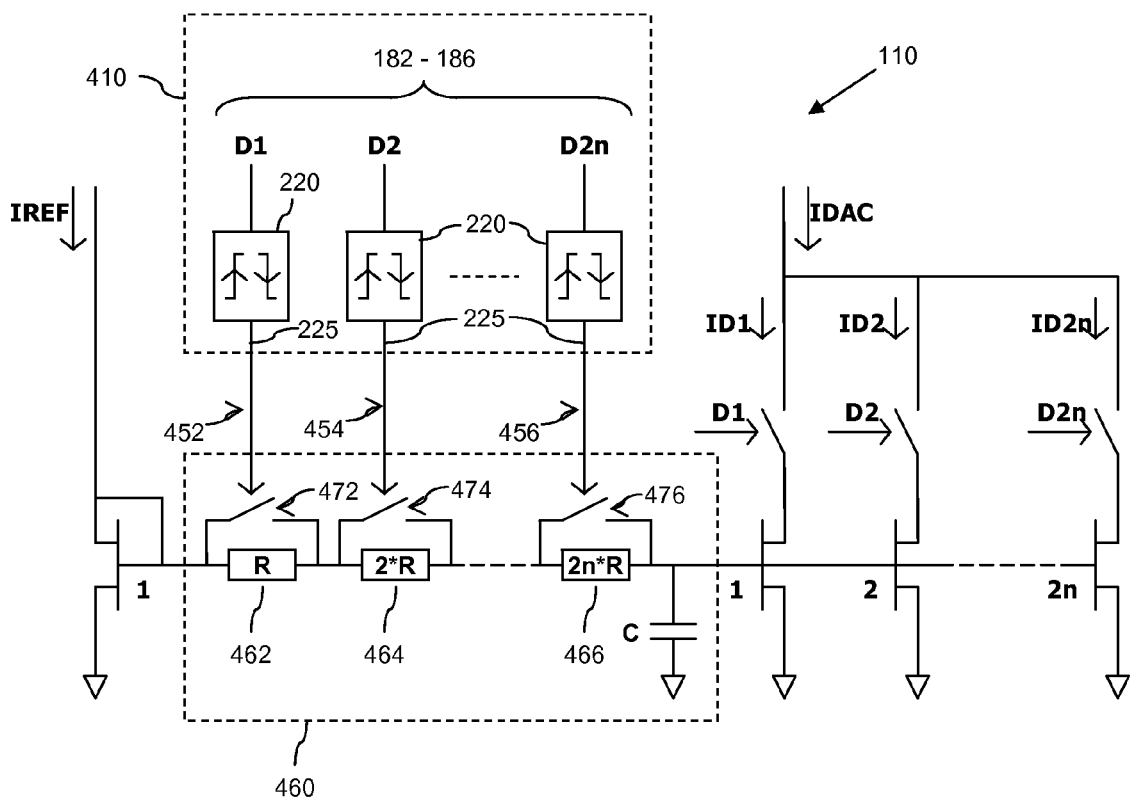
FIG. 4 shows a simplified block diagram of an third example of a digital to analogue converter module.

Referring now to FIG. 4, there is illustrated a still further example of the DAC module 110. In the example illustrated in FIG. 4, the DAC module 110 comprises alternative examples of a filter control module 410, and a filter component 460. The filter control module 410 comprises a plurality of edge detector components 220, each edge detector component 220 being arranged to detect at least one edge within at least one bit signal 182, 184, 186 of the digital input of the DAC module 110. The filter control module 410 is arranged to dynamically modify at least one characteristic of the filter component 460 upon detection of at least one edge within at least one bit signal 182, 184, 186 of the digital input of the DAC module 110 by at least one of the edge detector components 220. In particular for the illustrated example of FIG. 4, each edge detector component 220 is arranged to output an edge detection signal 225 comprising an indication of whether an edge has been detected within the respective bit signal 182, 184, 186. The filter control module 410 is arranged to output a plurality of control signals 452, 454, 456 comprising the edge detection signals 225 to weightedly modify at least one characteristic of the at least one filter component 460 upon detection of at least one edge within at least one bit signal 182, 184, 186 of the digital input of the DAC module 110 by at least one of the edge detector components 220.

In the example illustrated in FIG. 4, the DAC module 110 comprises a filter component 460 comprising a plurality of series resistance elements 462, 464, 466. The filter component 460 further comprises a plurality of controllable switching elements 472, 474, 476. Each controllable switching element 472, 474, 476 is operably coupled in parallel with at least one of the series resistance elements 462, 464, 466, and arranged to selectively create a reduced resistance circuit across the respective series resistance element(s) 462, 464, 466 in accordance with one or more of the control signals 452, 454, 456 output by the filter control module 410. In this manner, the controllable switching elements 472, 474, 476 may be arranged to selectively configure (in accordance with the control signal(s) 452, 454, 456) an operational mode of the filter component 460, and in particular to configure the RC product of the filter component 460, and thus to configure the stable state recovery time and noise characteristics of the DAC module 110.

In the illustrated example of FIG. 4, the series resistance elements 462, 464, 466 are arranged to comprise weighted resistance values; for example, and as illustrated, a first series resistance element 462 is arranged to comprise a resistance R, a second series resistance element 464 is arranged to comprise a resistance $2*R$, and so on through to a $2n^{th}$ series resistance element 466, which is arranged to comprise a resistance $2n*R$. Furthermore, each controllable switching element 472, 474, 476 is arranged to receive a control signal 452, 454, 456 comprising the edge detection signal corresponding to a respective bit signal 182, 184, 186 of the digital input of the DAC module 110. That is to say, in the illustrated example, the controllable switching element 472 operably coupled in parallel with the smallest resistance R 462 is arranged to receive a control signal 452 comprising the edge detection signal corresponding to the least significant bit signal 182 of the digital input of the DAC module 110; the controllable switching element 474 operably coupled in parallel with the second smallest resistance $2*R$ 464 is arranged to receive a control signal 454 comprising the edge detection signal corresponding to the second least significant bit signal 184 of the digital input of the DAC module 110; and so on through to the controllable switching element 476 operably coupled in parallel with the largest resistance $2n*R$ 466, which is arranged to receive a control signal 456 comprising the edge detection signal corresponding to the most significant bit signal 186 of the digital input of the DAC module 110. In this manner, the filter control module 410 is arranged to weightedly modify the RC product of the filter component 460 such that the amount by which the RC product of the filter component 460 is modified is directly related to the number and 'significance' of the bit signals 182, 184, 186 within which edges are detected.

Figure 5:
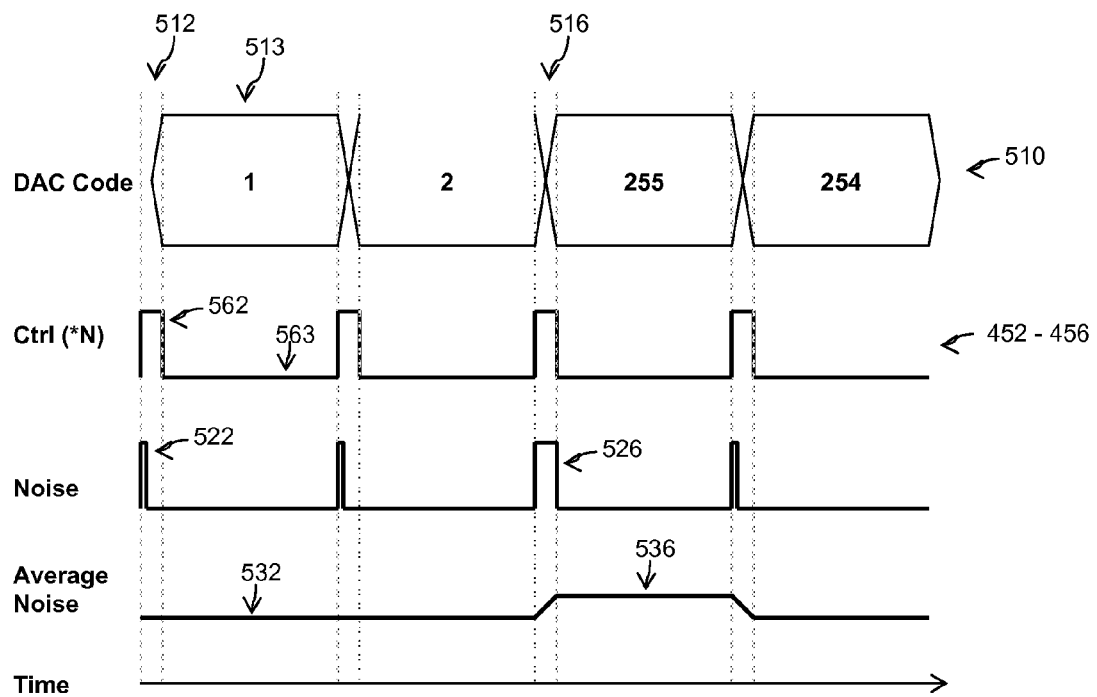
FIG. 5 shows a simplified signal diagram of an example of some of the signals within the example of FIG. 4

FIG. 5 illustrates a simplified signal diagram of an example of some of the signals within the DAC module 110 of FIG. 4. A digital input signal for the DAC module 110 comprising the bit signals 182, 184, 186 is illustrated at 510. The signal diagram of FIG. 5 starts with a transition period 512 within the digital input signal 510, for example triggered by an active edge within a clock signal (not shown). During this first transition period 512, a transition occurs within the digital input signal 510 whereby one or more of the bit signals 182, 184, 186 changes state, and thus comprises an edge. As described above, the filter control module 410 is arranged to output control signals 452, 454, 456, illustrated generally at 452-456 in FIG. 5, to dynamically modify the RC product characteristics of the filter component 460 upon at least one edge being detected within at least one of the bit signals 182, 184, 186 of the digital input 510 of the DAC module 110. Accordingly, and as indicated at 562, during the transition period 512 when an edge is present within one or more of the bit signals 182, 184, 186, one or more of the control signals 452, 454, 456 comprise(s) a transition mode state, which in the illustrated example comprises a '1' or 'HIGH' state.

In the example illustrated in FIG. 4, the transition mode state 562 (of FIG. 5) of the respective control signal(s) 452, 454, 456 cause(s) the respective controllable switching element(s) 472, 474, 476 to create a reduced resistance circuit across the respective series resistance element(s) 462, 464, 466 of the filter component 460. In this manner, the transition mode state 562 of the respective control signal(s) 452, 454, 456 cause(s) the filter component 460 to be configured to comprise a lower series resistance, whereby the configuration filter component 460 operates in a faster recovery mode. As such, because the filter component 460 is configured to operate in a faster recovery mode, the DAC module 110 is able to more quickly recover a stable state following a transition within the input signal 510. Nevertheless, and as indicated at 522, such a faster recovery mode may result in relatively high noise characteristics for the DAC module 110.

Following the transition period 512, the input signal 510 enters a stable state period 513 within the digital input signal 510. During this stable state period 513 no transitions occur within the digital input signal 510, and thus no edges will occur within the bit signals 182, 184, 186. For the illustrated example, during the stable state period 513, the filter control module 410 is arranged to cause the filter component 460 to operate in a stable state mode, since no edges will be detected within the bit signal 182, 184, 186 of the digital input 510. Accordingly, during the stable state period 513 when no edges are present within the bit signals 182, 184, 186, the control signal 452, 454, 456 comprises a stable mode state 563, which in the illustrated example comprises a '0' or 'LOW' state.

In the example illustrated in FIG. 4, the stable mode state 563 of the control signals 452, 454, 456 causes the controllable switching elements 472, 474, 476 to disconnect the reduced resistance circuits across the series resistance elements 462, 464, 466 of the filter component 460. In this manner, the stable mode state 563 of the controls 452, 454, 456 causes the filter component 460 to be configured to comprise a higher series resistance, whereby the configuration filter component 460 operates in a low noise mode. As such, during the stable state period 513 within the digital signal 510, the low noise mode enables relatively low noise characteristics to be achieved for the DAC module 110.

For the example illustrated in FIG. 4, the filter control module 410 is arranged to weightedly modify the RC product of the filter component 460 such that the amount by which the RC product of the filter component 460 is modified is directly related to the number and 'significance' of the bit signals 182, 184, 186 within which edges are detected. Accordingly, in the first transition period 512, edges may be detected within, say, only a small number of low significance bits 182, 184, 186 within the digital input of the DAC module 110. As such, the filter control module 410 is arranged to dynamically modify the RC product of the filter component 460 by only a relatively small amount (by virtue of the weighted and direct correlation between the bit signals and series resistance/switching arrangement for the example illustrated in FIG. 4). Since the number and significance of the bit signals comprising transitions is relatively low, the amount of recovery required by the DAC module 110 to achieve a steady state following such a transition will also be relatively small. Thus, such a small modification to the RC product may be sufficient to achieve a required recovery time. Advantageously, by only configuring a small modification to the RC product of the filter component 460 in this manner, the noise characteristics of the DAC module 110 will only be increased by a small amount; thereby enabling the average noise of the DAC module 110 over a complete cycle to remain low, as indicated generally at 532.

Conversely, for a transition period in which edges are detected within, say, a larger number of higher significance bits 182, 184, 186, such as transition period 516, the amount of recovery required by the DAC module 110 to achieve a steady state following such a transition may be greater. Accordingly, the filter control module 410 may be arranged to dynamically modify the RC product of the filter component 460 by a larger amount. In this manner, the ability of the DAC module 110 to achieve a steady state is improved, enabling a required recovery time to be achieved. As will be appreciated, such an increase in the RC product of the filter component may result in higher noise characteristics for the DAC module 110, as indicated at 526. As a result, a slight increase in the average noise of the DAC module 110 may occur for the corresponding cycle, as illustrated at 536. Nevertheless, the dynamic modification of the filter characteristics described above enable good stable state recovery times to be achieved, whilst also enabling low average noise characteristics for the DAC module 110 to be achieved.

Figure 6:
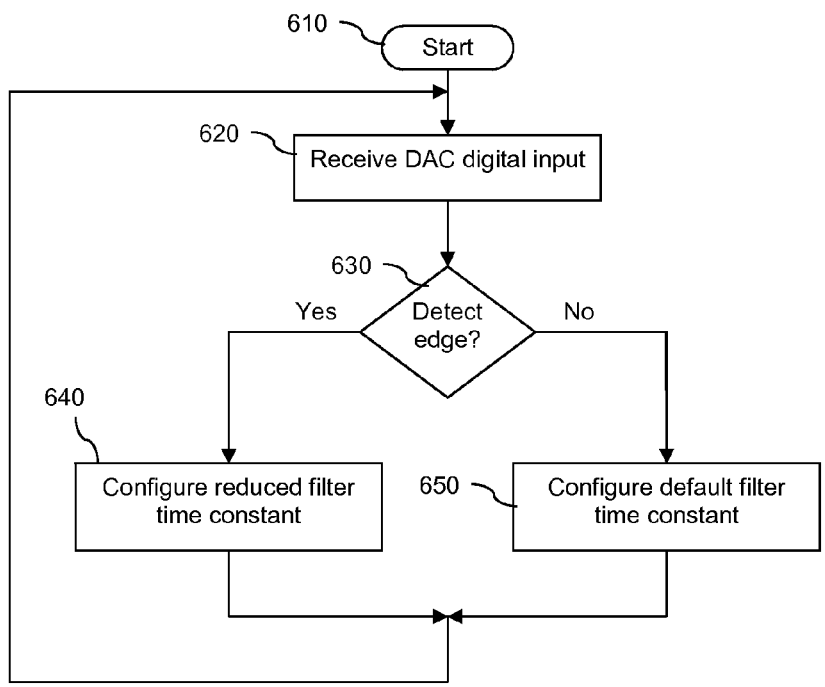
FIG. 6 shows a simplified flowchart of an example of a method of dynamically modifying at least one characteristic within a digital to analogue converter module.

Referring now to FIG. 6, there is illustrated a simplified flowchart 600 of an example of a method of dynamically modifying at least one filter characteristic within a digital to analogue converter (DAC) module, such as on of the DAC modules 110 of FIGS. 1, 2 and 4. The method starts at 610, and moves on to 620 where a digital input of the DAC is received. Next, at 630, edges within bit signals of the received digital input are detected The method further comprises dynamically modifying at least one characteristic of at least one filter component of the DAC module upon detection of at least one edge within the at least one bit signal of the received digital input signal of the DAC module. Specifically for the illustrated example, if an edge is detected within at least one bit signal at 630, the method moves on to 640 where a reduced time constant of the filter component is configured such that the DAC module is able to operate in a faster recovery mode. The method then loops back to 620. Referring back to 630, if no edge is detected within a bit signal of the digital input of the DAC module, the method moves on to 650, where an increased (or default) time constant of the filter component is configured such that the DAC module is able to operate in a low noise mode.

In some examples, a tangible computer program product having executable program code stored therein may embody examples of the invention, for example in dynamically modifying at least one filter characteristic within a digital to analogue converter (DAC). The program code is operable for, when executed at a digital to analogue converter (DAC), receiving a digital input signal; detecting edges within at least one bit signal of the received digital input signal; and dynamically modifying at least one characteristic of at least one filter component of the DAC module upon detection of at least one edge within the at least one bit signal of the received digital input signal of the DAC module (640).

Thus, examples of a method and apparatus have been described that enable the filter characteristics of a DAC module to be dynamically modified during periods of transition within bit signals of a digital input of the DAC module, and as such enable a dynamic operation of the DAC module to be achieved whereby a dynamically optimized trade-off between recovery rate and low noise characteristics may be achieved. Specifically for some examples such as the example illustrated in FIGS. 3 and 4, the described method and apparatus may enable the dynamic adaptation of the value of the filter time constant to the amplitude of the DAC code change to optimize the speed/noise ratio.

Advantageously for some examples, no external control signals are required, for example as may be provided by an external digital controller. Furthermore, the filter control module and filter component comprise a fully asynchronous system, and thus are able to operate even if a system clock is in standby mode.

Thus, some examples of the present invention enable a low cost implementation to be provided requiring few components, and requiring a small die area. Furthermore, some examples of the present invention enable a low power implementation to be provided, in particular during periods when the digital input DAC code is stable; the implementation being substantially transparent as regards power consumption.

For some examples, it is contemplated that the inventive concept may be extended to substantially any relationship between code variation and filter time constant modification, whether linear or not. In particular, although a linear relationship between a code variation value and filter time constant variation has been described herein, it is contemplated that, for certain conditions, a non-linear function (e.g. LOG or 1/x) may be implemented, and may provide improved results over the linear relationship.

In the foregoing specification, the invention has been described with reference to specific examples of embodiments of the invention. It will, however, be evident that various modifications and changes may be made therein without departing from the broader spirit and scope of the invention as set forth in the appended claims.

For example, the connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms 'assert' or 'set' and 'negate' (or 'de-assert' or 'clear') are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, for clarity the filter control modules and filter components in the illustrated example have been illustrated and described as separate function modules. However, in practice the functionality of a filter control module may be incorporated within the filter component.

Any arrangement of components to achieve the same functionality is effectively 'associated' such that the desired functionality is achieved. Hence, any two components herein combined to achieve a particular functionality can be seen as 'associated with' each other such that the desired functionality is achieved, irrespective of architectures or intermediary components. Likewise, any two components so associated can also be viewed as being 'operably connected,' or 'operably coupled,' to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit device comprising a digital to analogue converter (DAC) module, the DAC module comprising:
   a current replicator component comprising:
      a first channel terminal, a second channel terminal; and
      a reference voltage terminal arranged to receive a reference voltage signal, wherein the current replicator component is arranged to moderate a current flowing between the first and second channel terminals based at least partly on the received reference voltage signal;
   a filter component operably coupled to the reference voltage terminal of the current replicator component and arranged to perform filtering of the reference voltage signal; and
   a filter control module, wherein the filter control module is arranged to:
      detect a state change of a digital input of the DAC module; and
      dynamically modify a characteristic of the filter component in response to detecting said stage change.

2. The integrated circuit device of claim 1 wherein the filter control module is arranged to detect an edge within bit signal of said digital signal.

3. The integrated circuit device of claim 1, wherein the filter control module causes the filter component to operate in a transition mode when dynamically modifying the characteristic of the filter component.

4. The integrated circuit device of claim 1 wherein the filter control module is further arranged to cause the filter component to operate in a stable state mode when said state change is not detected.

5. The integrated circuit device of claim 1 wherein the filter control module is arranged to dynamically reduce a time constant of the filter component upon detection of said state change.

6. The integrated circuit device of claim 4 wherein the filter component comprises a series resistance capacitance filter, and the filter control module is arranged to dynamically reduce a series resistance characteristic of the filter component upon detection of said state change.

7. The integrated circuit device of claim 6 wherein the filter component comprises a controllable switching element operably coupled in parallel with a series resistance element of the filter component.

8. The integrated circuit device of claim 7 wherein the controllable switching element is arranged to selectively create a reduced resistance circuit across the series resistance element in accordance with a control signal output by the filter control module.

9. The integrated circuit device of claim 1 wherein the filter control module comprises a plurality of edge detector components, each edge detector component being arranged to detect an edge within a bit signal of the digital input of the DAC module.

10. The integrated circuit device of claim 9 wherein the filter control module is arranged to dynamically modify a characteristic of the component upon detection of an edge within a bit signal by the edge detector components.

11. The integrated circuit device of claim 10 wherein a number of the plurality of edge detector components are arranged to output an edge detection signal comprising an indication of whether an edge has been detected within the respective bit signal; and
the filter control module further comprises at least one of an OR gate and a NOR gate, the at least one OR gate and NOR gate being arranged to receive the indication output by the number of edge detector components and to output a control signal.

12. The integrated circuit device of claim 11 wherein the at least one OR gate and NOR gate outputs a control signal that dynamically modifies a characteristic of the filter component upon an edge detector component outputting an indication of an edge being detected within a bit signal.

13. The integrated circuit device of claim 11 wherein a number of the edge detector components is/are arranged to output an edge detection signal comprising an indication of whether an edge has been detected within the respective bit signal; and
wherein the filter control module is arranged to output a plurality of control signals comprising the edge detection signals to weightedly modify a characteristic of the filter component upon detection of an edge within a bit signal by an edge detector component of the plurality of edge detector components.

14. The integrated circuit device of claim 1 wherein the DAC module further comprises a reference component comprising a first channel terminal, a second channel terminal, and a reference voltage terminal.

15. The integrated circuit device of claim 14 wherein the current reference component is arranged to generate the reference voltage signal at the reference voltage terminal thereof based at least partly on a reference current flowing between the first and second channel terminals thereof.

16. The integrated circuit device of claim 14 of wherein the filter component is operably coupled between the reference voltage terminal of the current reference component and the reference voltage terminal of the current replicator component.

17. The integrated circuit device of claim 1 wherein the DAC module comprises a current steering DAC for controlling a biasing current within a radio frequency device.

18. A digital to analogue converter (DAC) module comprising:
a current replicator component comprising:
a first channel terminal;
a second channel terminal; and
a reference voltage terminal arranged to receive a reference voltage signal, wherein the current replicator component is arranged to moderate a current flowing between the first and second channel terminals based at least partly on the received reference voltage signal;
a filter component operably coupled to the reference voltage terminal of the current replicator component and arranged to perform filtering of the reference voltage signal; and
a filter control module arranged to: detect a state change of a digital input of the DAC module; and dynamically modify a characteristic of the filter component.

19. A method of dynamically modifying a filter characteristic within a digital to analogue converter (DAC) module, the method comprising:
receiving a digital input signal of the DAC module;
detecting edges within a bit signal of the received digital input signal of the DAC module; and
dynamically modifying a characteristic of a filter component of the DAC module upon detection of a state change of the received digital input signal of the DAC module based on a detected edge within the bit signal of the received digital input signal.

20. The method of claim 19, further comprising:
receiving at a reference voltage terminal of a current replicator component of the DAC module, a reference voltage signal, wherein the current replicator component is arranged to moderate a current flowing between first and second channel terminals of the current replicator component based at least partly on the received reference voltage signal; and
filtering, at a filter component, the reference voltage signal.

* * * * *